(12) United States Patent
Yang et al.

(10) Patent No.: US 11,037,821 B2
(45) Date of Patent: Jun. 15, 2021

(54) MULTIPLE PATTERNING WITH SELF-ALIGNMENT PROVIDED BY SPACERS

(71) Applicant: GLOBALFOUNDRIES U.S. Inc., Santa Clara, CA (US)

(72) Inventors: Xiaoming Yang, Ballston Lake, NY (US); Haiting Wang, Clifton Park, NY (US); Hong Yu, Clifton Park, NY (US); Jeffrey Chee, Ballston Lake, NY (US); Guoliang Zhu, Rexford, NY (US)

(73) Assignee: GLOBALFOUNDRIES U.S. INC., Santa Clara, CA (US)

(*) Notice: Subject to any disclaimer, the term of this patent is extended or adjusted under 35 U.S.C. 154(b) by 47 days.

(21) Appl. No.: 16/400,481

(22) Filed: May 1, 2019

(65) Prior Publication Data
US 2020/0350202 A1 Nov. 5, 2020

(51) Int. Cl.
*H01L 21/768* (2006.01)
*H01L 23/528* (2006.01)
*H01L 23/522* (2006.01)
*H01L 21/033* (2006.01)
*H01L 21/32* (2006.01)
*H01L 21/311* (2006.01)

(52) U.S. Cl.
CPC .... *H01L 21/76816* (2013.01); *H01L 21/0335* (2013.01); *H01L 21/0337* (2013.01); *H01L 21/0338* (2013.01); *H01L 21/31144* (2013.01); *H01L 21/32* (2013.01); *H01L 21/76802* (2013.01); *H01L 21/76877* (2013.01); *H01L 23/5226* (2013.01); *H01L 23/5283* (2013.01)

(58) Field of Classification Search
CPC ............ H01L 21/0332; H01L 21/0335; H01L 21/0337; H01L 21/0338; H01L 21/31144; H01L 21/32; H01L 21/76802; H01L 21/76816; H01L 21/76877; H01L 23/5226; H01L 23/5283
See application file for complete search history.

(56) References Cited

U.S. PATENT DOCUMENTS

| 8,415,089 | B1 | 4/2013 | Gupta et al. |
| 9,177,797 | B2 | 11/2015 | Chang et al. |
| 9,490,136 | B1* | 11/2016 | Chang ............... H01L 21/0337 |
| 10,170,306 | B2* | 1/2019 | Lee .................. H01L 21/0274 |

(Continued)

OTHER PUBLICATIONS

Woo et al., "Design and process technology co-optimization with SADP BEOL in sub-10nm SRAM bitcell," 2015 IEEE International Electron Devices Meeting (IEDM), Washington, DC, 2015, pp. 11.2.1-11.2.4.

*Primary Examiner* — Matthew E Warren
(74) *Attorney, Agent, or Firm* — Thompson Hine LLP; Anthony Canale

(57) ABSTRACT

Methods of forming interconnects and structures for interconnects. A hardmask layer is patterned to form a plurality of first trenches arranged with a first pattern, and sidewall spacers are formed inside the first trenches on respective sidewalls of the hardmask layer bordering the first trenches. An etch mask is formed over the hardmask layer. The etch mask includes an opening exposing a portion of the hardmask layer between a pair of the sidewall spacers. The portion of the hardmask layer exposed by the opening in the etch mask is removed to define a second trench in the hardmask layer.

13 Claims, 5 Drawing Sheets

(56) References Cited

U.S. PATENT DOCUMENTS

| | | | |
|---|---|---|---|
| 10,170,307 B1* | 1/2019 | Huang | H01L 21/28035 |
| 2015/0171010 A1 | 6/2015 | Bristol et al. | |
| 2017/0352584 A1* | 12/2017 | Yaegashi | H01L 21/0338 |
| 2018/0164698 A1* | 6/2018 | Yang | G03F 7/0043 |
| 2018/0323067 A1* | 11/2018 | Shu | H01L 23/5256 |

* cited by examiner

MULTIPLE PATTERNING WITH SELF-ALIGNMENT PROVIDED BY SPACERS

BACKGROUND

The present invention relates to semiconductor device fabrication and integrated circuits and, more specifically, to methods of forming interconnects and structures for interconnects.

A back-end-of-line interconnect structure may be used to connect device structures, which are fabricated on a chip during front-end-of-line processing, with each other and with the environment external to the chip. Multiple patterning techniques may be used to form the interconnects of the back-end-of-line interconnect structure. For example, a double-patterning technique based on a series of lithography and etching steps may be utilized. In litho-etch double patterning (i.e., LELE), a pattern is divided into two parts or colors, each of which may be conventionally processed, that are combined in the final patterned interlayer dielectric layer. Trenches may be patterned in an interlayer dielectric layer using a sequence of two separate exposures and etchings of independent subpatterns into the same interlayer dielectric layer. For each subpattern, a unique photoresist coating is required. When the sequence is completed, the pattern is a superimposed, composite of the previously etched subpatterns. By interleaving the subpatterns, the pattern density can be increased with the half-pitch being inversely proportional to the number of subpatterns used. For example, a twenty-five (25) nm pitch pattern can be generated from interleaving a pair of fifty (50) nm half-pitch patterns using litho-etch double patterning. However, litho-etch double patterning has limits on the pitch of the pattern that can be generated. Specifically, interconnects formed in an interlayer dielectric layer by conventional litho-etch double patterning have a pitch that is limited by lithography resolution to greater than or equal to sixty-four (64) nanometers.

Improved methods of forming interconnects and structures for interconnects are therefore needed.

SUMMARY

In an embodiment of the invention, a method includes patterning a hardmask layer to form a plurality of first trenches arranged with a first pattern, forming sidewall spacers inside the first trenches on respective sidewalls of the hardmask layer bordering the first trenches, and forming an etch mask over the hardmask layer. The etch mask includes an opening exposing a portion of the hardmask layer between a pair of the sidewall spacers. The method further includes removing the portion of the hardmask layer exposed by the opening in the etch mask to define a second trench in the hardmask layer.

In an embodiment of the invention, a method includes forming a first etch mask with a first lithography process over a hardmask layer that includes a plurality of openings exposing first portions of the first hardmask layer, removing the first portions of the hardmask layer with a first etching process to form the first trenches at respective locations of the openings in the second etch mask, and forming sidewall spacers inside the first trenches on respective sidewalls of the hardmask layer bordering the first trenches. The method further includes forming, with a second lithography process, a second etch mask over the hardmask layer. The second etch mask includes an opening exposing a second portion of the hardmask layer between a pair of the sidewall spacers. The second portion of the first hardmask layer exposed by the opening in the second etch mask is removed with a second etching process to define a second trench in the hardmask layer.

In an embodiment of the invention, a structure includes a metallization level having an interlayer dielectric layer, a first plurality of interconnects in the interlayer dielectric layer, and a second plurality of interconnects in the interlayer dielectric layer. The first plurality of interconnects have a first pitch, and the second plurality of interconnects have a second pitch that is different from the first pitch.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

FIG. 6A is a top view of the structure in which FIG. 6 is taken generally along line 6-6.

FIG. 8A is a top view of the structure in which FIG. 8 is taken generally along line 8-8.

DETAILED DESCRIPTION

Figure 1:
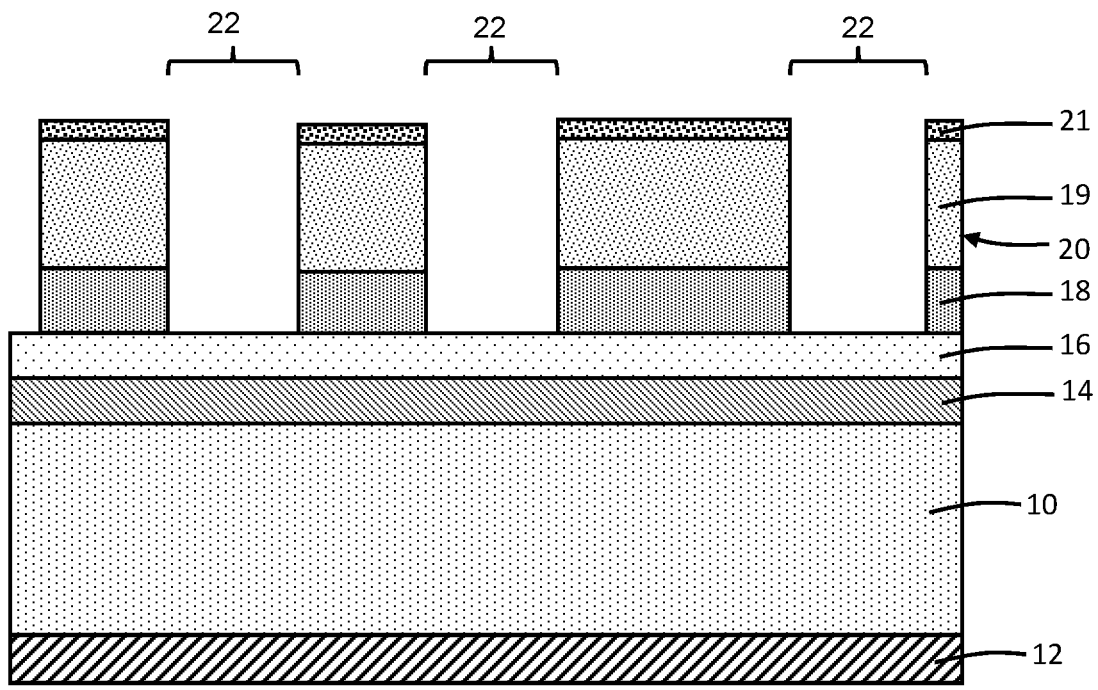
FIGS. 1-5 are cross-sectional views of a structure at successive fabrication stages of a processing method in accordance with embodiments of the invention.

With reference to FIG. 1 and in accordance with embodiments of the invention, an interlayer dielectric layer 10 may be composed of one or more electrically-insulating dielectric materials, such as a low-k dielectric material formed using a siloxane such as octamethylcyclotetrasiloxane (OMCTS). The interlayer dielectric layer 10 may be located over an etch stop layer 12 that is composed of a dielectric material having etch selectivity relative to the dielectric material of the interlayer dielectric layer 10. For example, the etch stop layer 12 may be composed of a carbon-containing silicon nitride, such as silicon-carbon-nitride (SiCN). The interlayer dielectric layer 10 and etch stop layer 12 may be components of a metallization level of a back-end-of-line interconnect structure that is arranged over a substrate of a chip including device structures of an integrated circuit fabricated by front-end-of-line (FEOL) processing.

Hardmask layers 14, 16, 18 are arranged in a layer stack over the interlayer dielectric layer 10 and are sequentially deposited on the interlayer dielectric layer 10. In the layer stack, the hardmask layer 18 is the topmost layer, the hardmask layer 14 is the bottommost layer, and the hardmask layer 16 is arranged between the hardmask layer 18 and the hardmask layer 16. The hardmask layer 14 is arranged on the interlayer dielectric layer 10, and may be composed of an oxygen-containing silicon nitride, such as silicon-oxynitride (SiON). The hardmask layer 16 is arranged on the hardmask layer 14, and may be composed of a metal nitride, such as titanium nitride (TiN). The hardmask layer 18 is arranged on the hardmask layer 14, and may be composed an oxygen-containing silicon nitride, such as silicon-oxynitride (SiON). In an embodiment, the hardmask layer 14 and the hardmask layer 18 may be composed of the same dielectric material.

The hardmask layer 18 is patterned with lithography and etching processes. To that end, an etch mask 20 is formed by applying a lithography stack that includes a spin-on hardmask 19 and an overlying hardmask 21, and patterning the lithography stack with lithography and etching processes to expose selected portions of the hardmask layer 18 and to mask selected portions of the hardmask layer 18 with shapes. After forming the etch mask 20, the hardmask layer 18 is etched with an etching process that removes the exposed portions of the hardmask layer 18 to define trenches 22. The trenches 22 penetrate fully through the hardmask layer 18 to the hardmask layer 16, which may function as an etch stop. The trenches 22 provide a pattern of a first color that is memorized in the hardmask layer 18 as residual portions of the hardmask layer 18 that cover and mask portions of the hardmask layer 16 and removed portions of the hardmask layer 18 that expose other portions of the hardmask layer 16.

Figure 2:
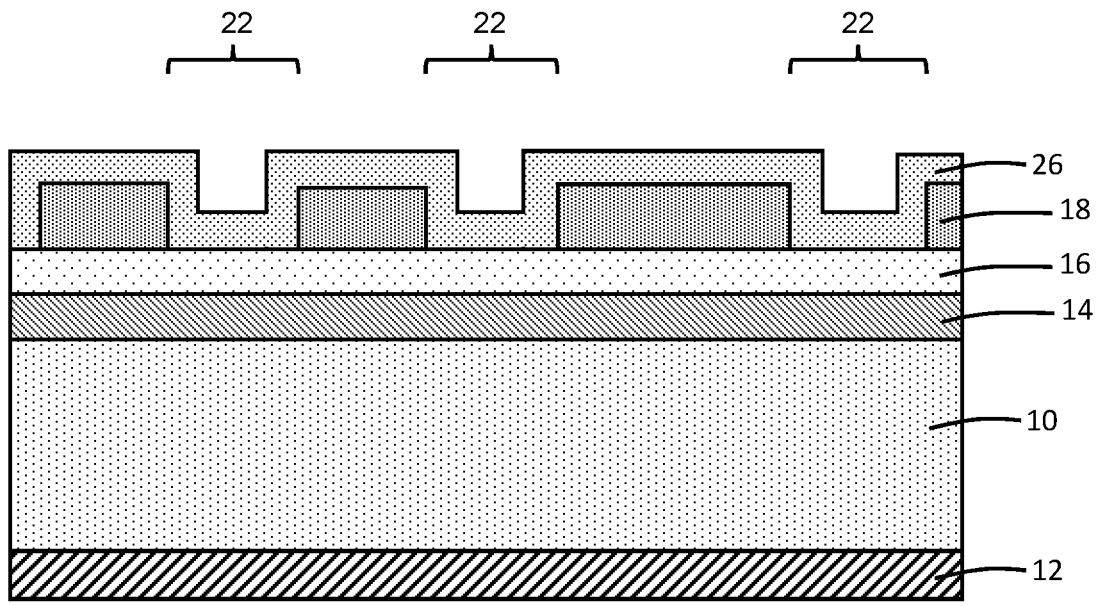

With reference to FIG. 2 in which like reference numerals refer to like features in FIG. 1 and at a subsequent fabrication stage of the processing method, the etch mask 20 is removed, and a dielectric layer 26 is conformally deposited that coats the residual portions of the patterned hardmask layer 18 and portions of the hardmask layer 16 that are exposed by the patterning of the hardmask layer 18. The dielectric layer 26 has a thickness that is selected to avoid pinch off during deposition within the trenches 22. The dielectric layer 26 is a conformal layer that may be composed of a dielectric material, such as silicon nitride, aluminum oxide, or titanium oxide, deposited by atomic layer deposition.

Figure 3:
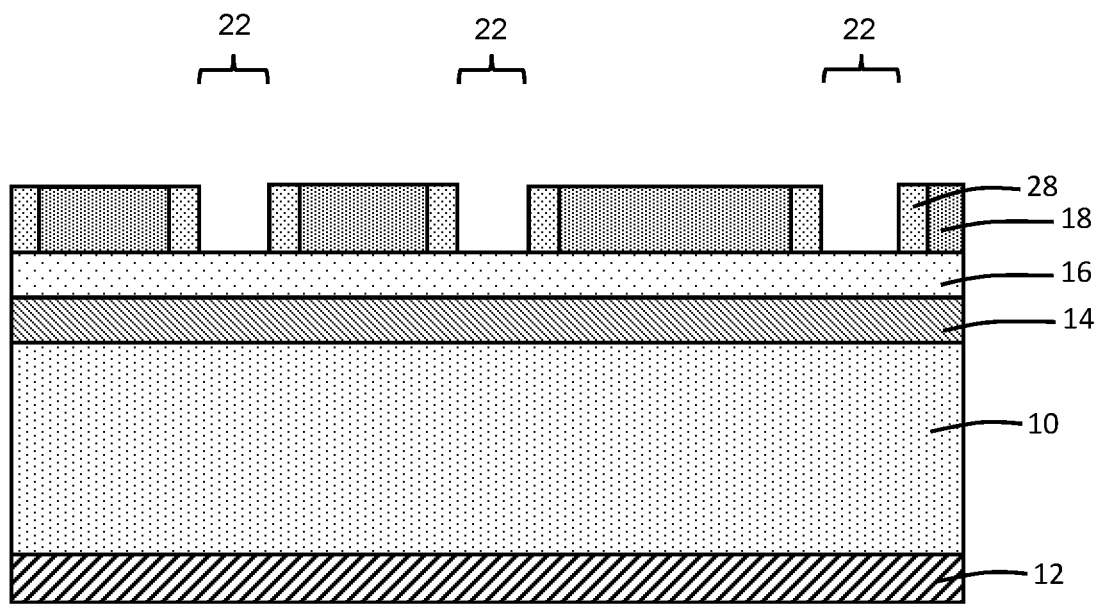

With reference to FIG. 3 in which like reference numerals refer to like features in FIG. 2 and at a subsequent fabrication stage of the processing method, the dielectric layer 26 is etched by an etching process to form sidewall spacers 28 inside the trenches 22. The sidewall spacers 28 are arranged on the sidewalls of the hardmask layer 18 bordering each trench 22. The dielectric layer 26 is removed from the top surface of the portions of the hardmask layer 18 and from the portions of the hardmask layer 16 between the sidewall spacers 28. The etching process may be an anisotropic etching process, such as reactive ion etching (ME), that removes the material of the dielectric layer 26 selective to the materials of the hardmask layers 16 and 18. As used herein, the terms "selective" and "selectivity" in reference to a material removal process (e.g., etching) denotes that the material removal rate (i.e., etch rate) for the targeted material is higher than the material removal rate (i.e., etch rate) for at least another material exposed to the material removal process. The sidewall spacers 28 narrow the width dimension of each trench 22 by an amount equal to the twice the thickness of the sidewall spacers 28, which effectively reduces the width dimension of the trenches 22 in the pattern of the first color that is memorized in the hardmask layer 18.

Figure 4:
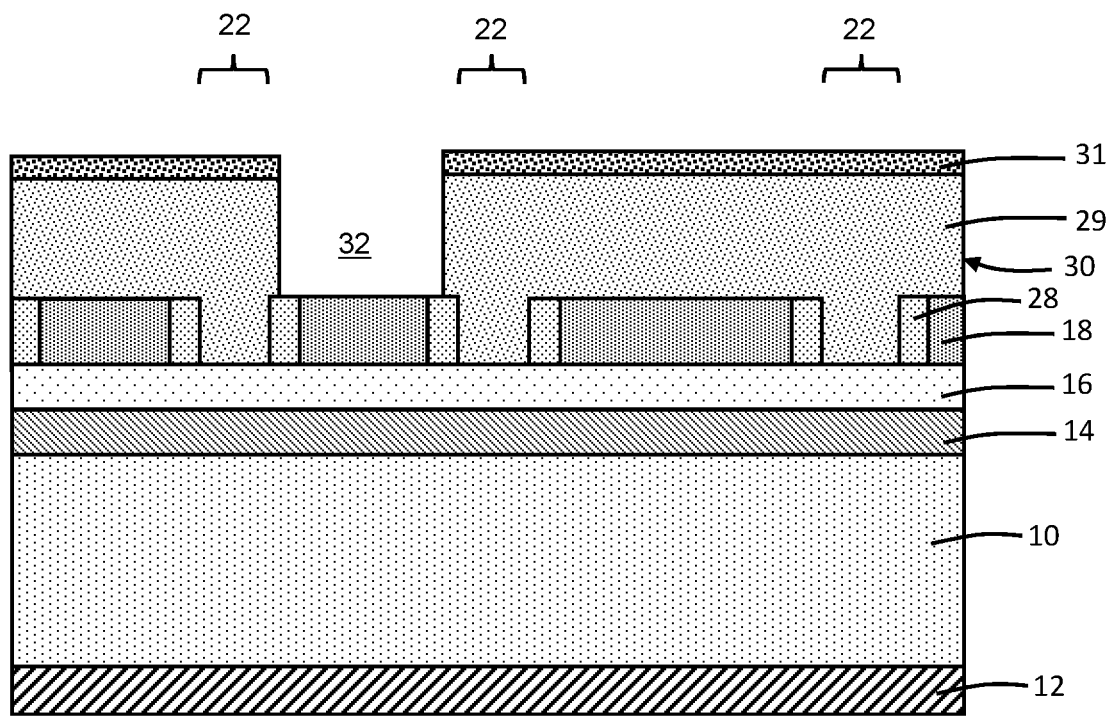

With reference to FIG. 4 in which like reference numerals refer to like features in FIG. 3 and at a subsequent fabrication stage of the processing method, an etch mask 30 is formed by applying a lithography stack that includes a spin-on hardmask 29 and an overlying hardmask 31, and patterning the lithography stack with lithography and etching processes to form an opening 32 that exposes a selected portion of the hardmask layer 18. The opening 32 in the etch mask 30 has a width dimension that may be greater than the width dimension of the exposed portion of the hardmask layer 18 to increase the misalignment tolerance of the opening 32. As a result, the opening 32 also overlaps in its width dimension with the sidewall spacers 28 positioned at the side edges of the exposed portion of the hardmask layer 18. The etch mask 30 masks other portions of the hardmask layer 18, the portions of the hardmask layer 16 exposed by trenches 22, and the sidewall spacers 28 bordering the trenches 22. The etching process removes the material of the spin-on hardmask 29 selective to the materials of the hardmask layer 18 and sidewall spacers 28.

Figure 5:
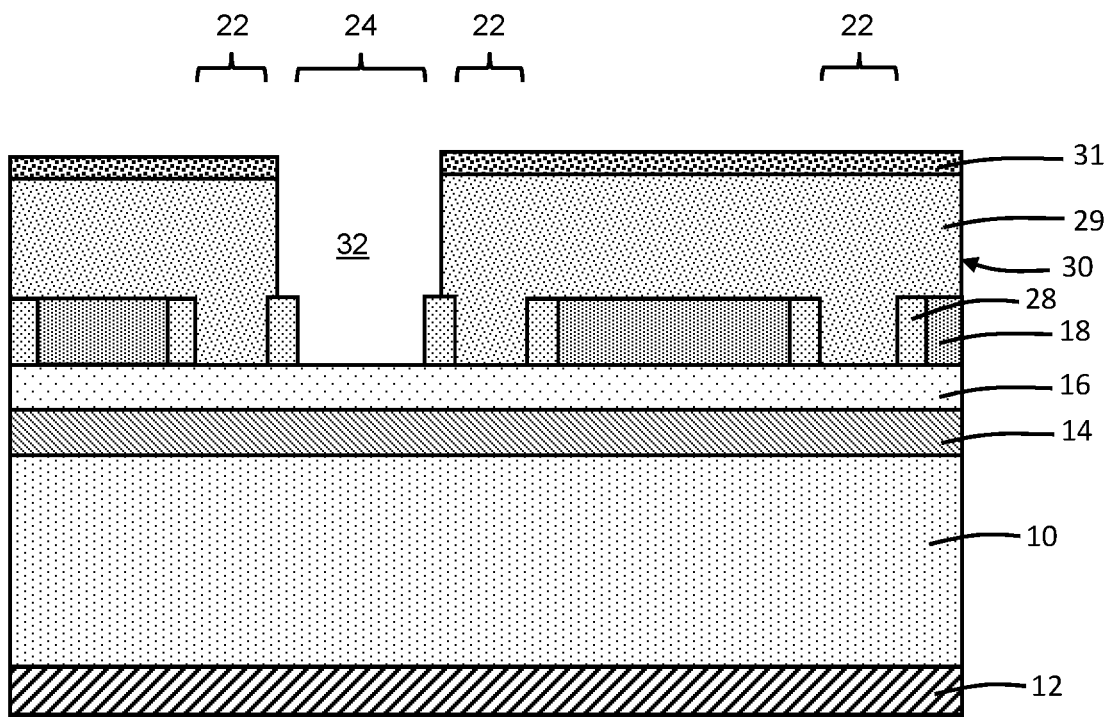

With reference to FIG. 5 in which like reference numerals refer to like features in FIG. 4 and at a subsequent fabrication stage of the processing method, the portion of the hardmask layer 18 exposed by the opening 32 in the etch mask 30 is removed from its position between the sidewall spacers 28 with an etching process to define a trench 24. The etching process may be an anisotropic etching process, such as reactive ion etching, that removes the material of the hardmask layer 18 selective to the materials of the hardmask layer 16 and the sidewall spacers 28. The sidewall spacers 28 self-align the etching process removing the exposed portion of the hardmask layer 18. The trench 24 has a width dimension substantially equal to the width dimension of the removed portion of the hardmask layer 18, and contributes to forming a pattern of a second color. Sidewall spacers 28 are respectively arranged between the trench 24 and its neighboring trenches 22, and define the width of dielectric material of the interlayer dielectric layer 10 arranged between the subsequently-formed interconnects. The trench 24 may be considered to be a pattern of the second color that is superimposed on the first-color pattern provided by the trenches 22 to define a composite pattern of trenches 22, 24.

Figure 6:
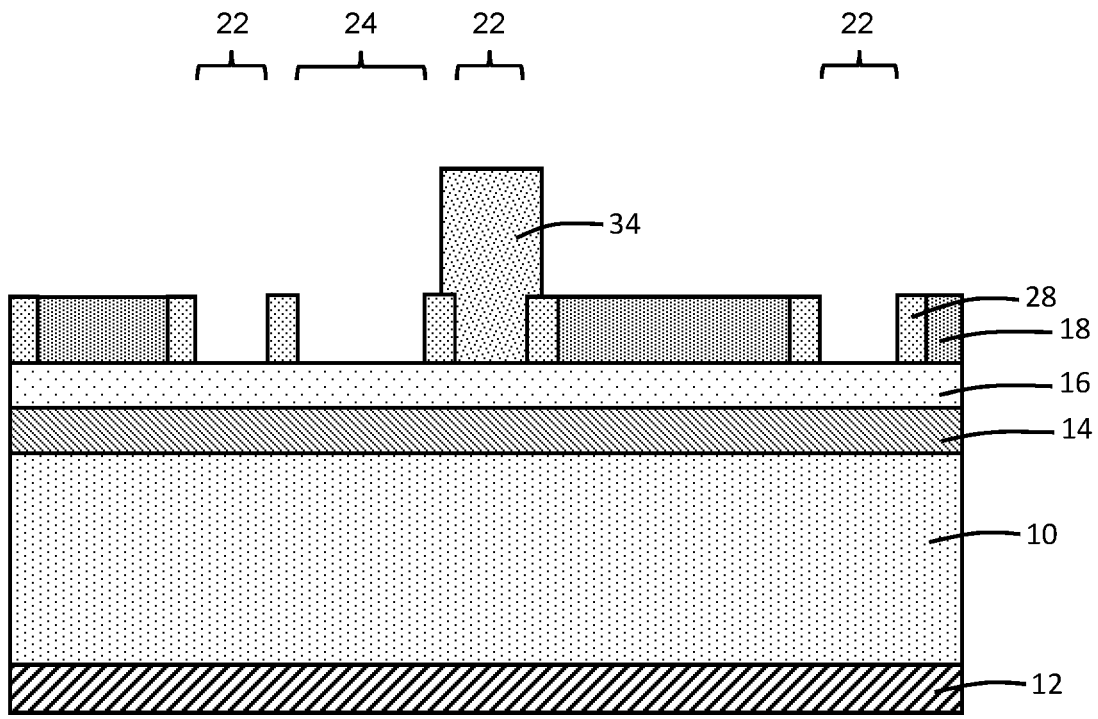
FIG. 6 is a cross-sectional view of a structure at a fabrication stage of the processing method subsequent to FIG. 5.
Figure 6A:
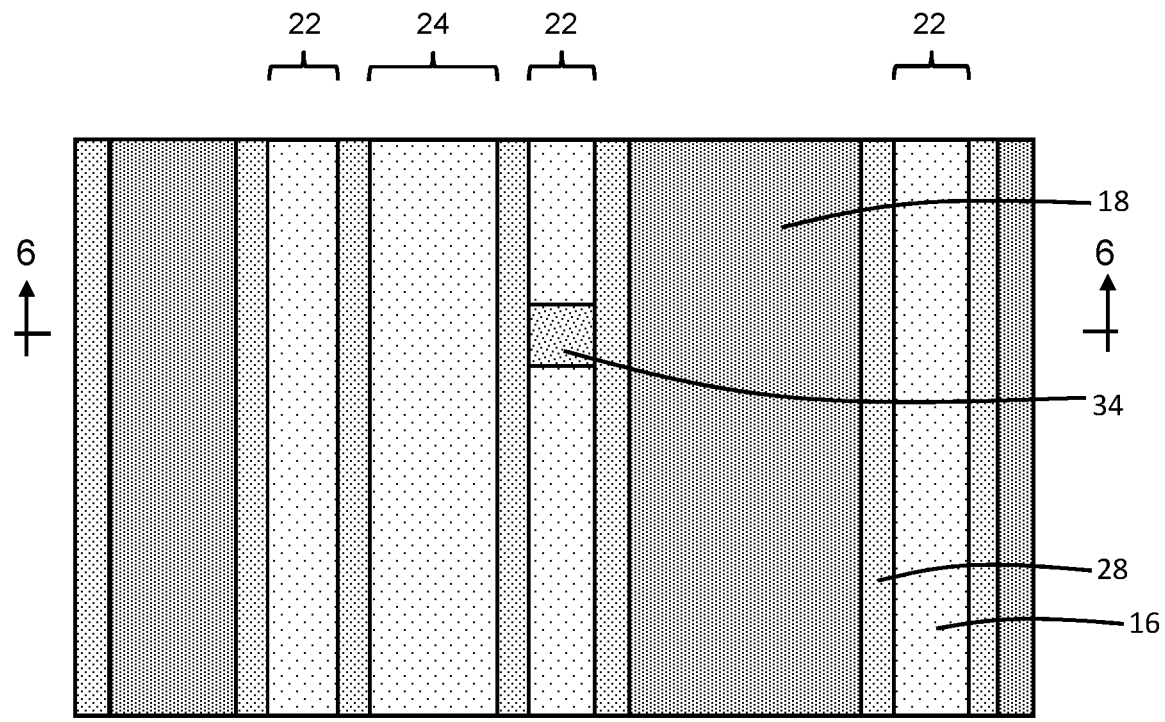

With reference to FIGS. 6, 6A in which like reference numerals refer to like features in FIG. 5 and at a subsequent fabrication stage of the processing method, the etch mask 30 is removed, and a block mask 34 is formed. The block mask 34 is formed by patterning a spin-on hardmask and an overlying hardmask with lithography and etching processes. The block mask 34 covers a rectangular section of the hardmask layer 16 and overlaps with an adjacent pair of the sidewall spacers 28. The block mask 34 defines a region for forming a dielectric-filled cut between the ends or tips of adjacent interconnects that are subsequently formed. The block mask 34 is formed in the process flow after the trenches 22, 24 are patterned.

Figure 7:
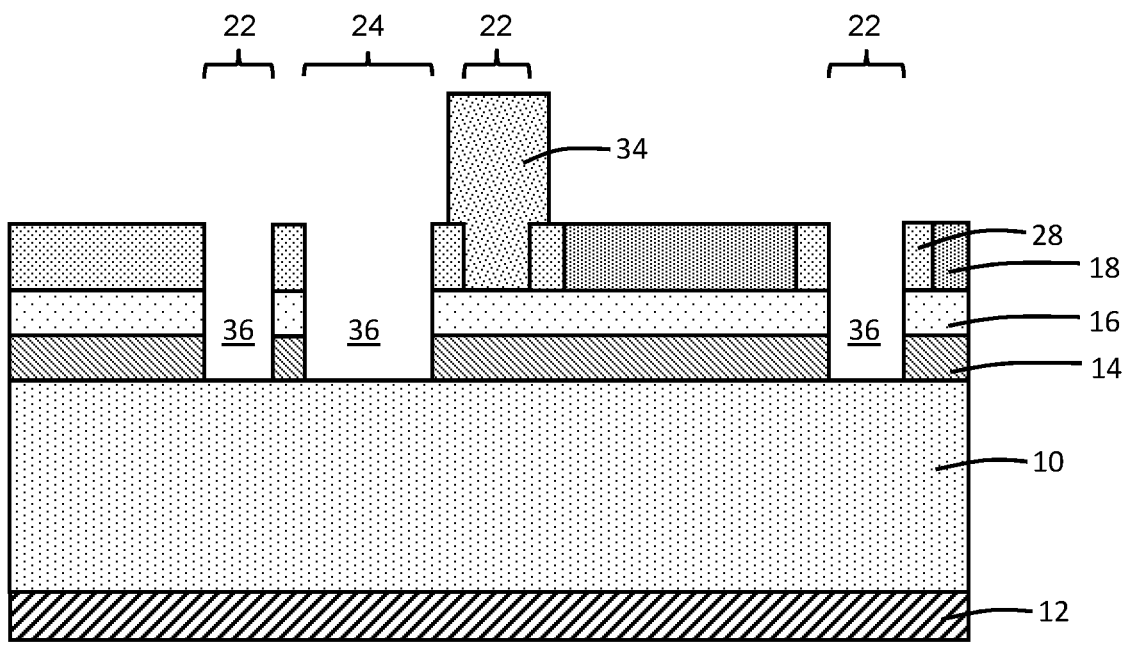
FIG. 7 is a cross-sectional view of a structure at a fabrication stage of the processing method subsequent to FIG. 6.

With reference to FIG. 7 in which like reference numerals refer to like features in FIG. 6 and at a subsequent fabrication stage of the processing method, the hardmask layer 14 and the hardmask layer 16 are successively etched with different etching processes to define trenches 36 in the hardmask layers 14, 16 having a composite pattern given by the different patterns defined by the trenches 22, 24 in the hardmask layer 18. An initial etching process may be an anisotropic etching process, such as reactive ion etching, that removes the material of the hardmask layer 16 selective to the materials of the hardmask layers 14 and 18, the sidewall spacers 28, and the block mask 34. A subsequent etching process may be an anisotropic etching process, such as reactive ion etching, that removes the material of the hardmask layer 14 selective to the materials of the hardmask layer 18, the sidewall spacers 28, and the block mask 34. The hardmask layer 18, the sidewall spacers 28, and the block mask 34 may be removed after the formation of the trenches 36.

Figure 8:
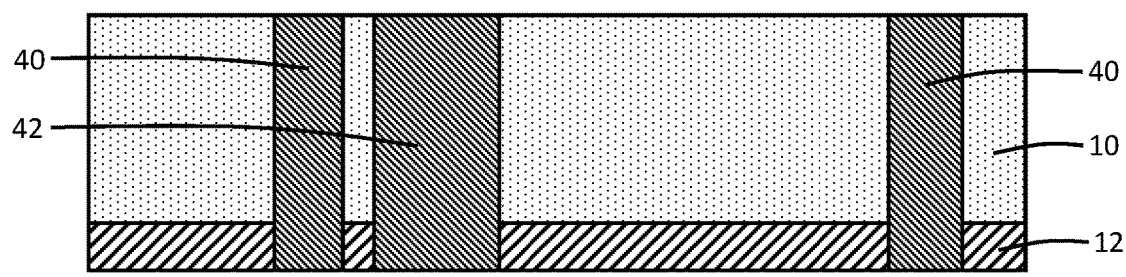
FIG. 8 is a cross-sectional view of a structure at a fabrication stage of the processing method subsequent to FIG. 7.
Figure 8A:
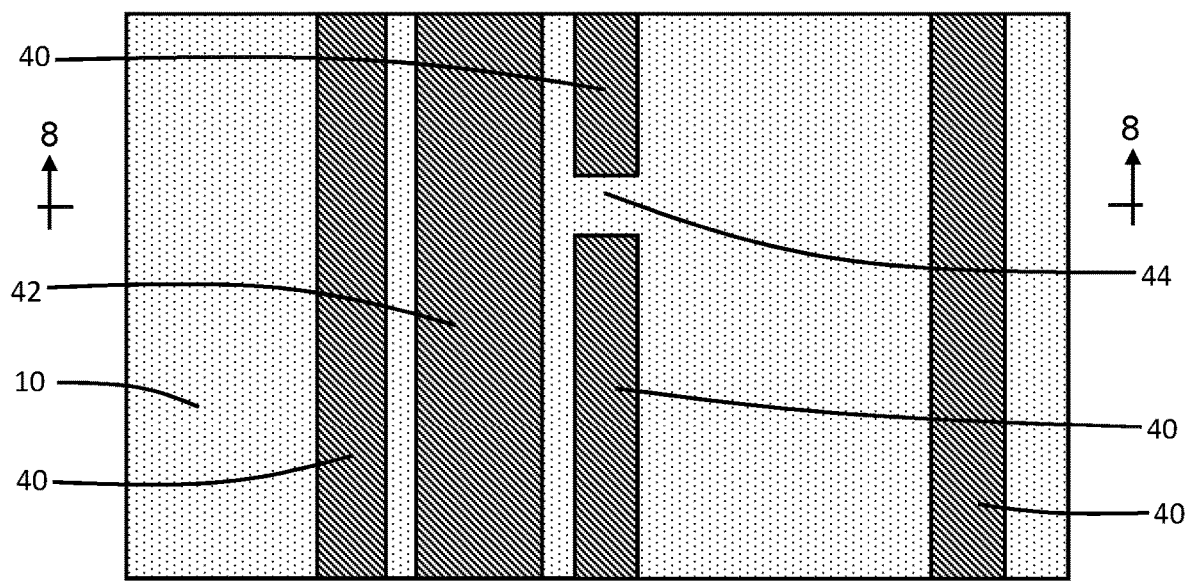

With reference to FIGS. 8, 8A in which like reference numerals refer to like features in FIG. 7 and at a subsequent fabrication stage of the processing method, the pattern of trenches 36 is transferred from the hardmask layers 14, 16 to the interlayer dielectric layer 10 and the underlying etch stop layer 12. The hardmask layers 14, 16 are removed, and interconnects 40, 42 are then formed in the trenches 36 in the interlayer dielectric layer 10 and etch stop layer 12. The primary conductor of the interconnects 40, 42 may be composed of a low-resistivity metal formed using a deposition process, such as copper or cobalt deposited by electroplating or electroless deposition or by chemical vapor deposition. A liner (not shown) composed of titanium, titanium nitride, tantalum, tantalum nitride, or a layered combination of these materials (e.g., a bilayer of tantalum nitride and tantalum) may be applied to the walls of the trenches 36 before filling with the primary conductor. The interconnects 40, 42 are conductive features that are located in the same metallization level in a back-end-of-line interconnect structure. In an embodiment, the interconnects 40, 42 may be located in the metallization level that is the closest of multiple metallization levels in the back-end-of-line interconnect structure to the front-end-of-line device structures, and in which the interconnects 40, 42 may be connected with the device structures by contacts in an intervening contact level.

The interconnects 40 and the interconnects 42 are the product of the different color patterns producing the trenches 22, 24, and the resulting pattern of interconnects 40, 42 represents a composite of those different color patterns. One of the interconnects 40 is divided by a cut 44 that is filled by the dielectric material of the interlayer dielectric layer 10, and that results from the formation of the block mask 34. The pitch of the interconnects 40, 42 is reduced by the introduction of the sidewall spacers 28 into the trenches 22, and the thickness of the sidewall spacers 28 may in part determine the composite pitch of the interconnects 40, 42 by determining the width of the section of the interlayer dielectric layer 10 between the interconnect 42 and the adjacent interconnects 40. The pitch of the interconnects 40, 42 is reduced without resorting to a self-aligned multiple patterning process that does not involve lithography and etching of patterns of different colors, and that is only able to form a pattern of a single pitch. The interconnects 40, 42 are interleaved in the interlayer dielectric layer 10 with the interconnect 42 arranged between the interconnects 40.

In an embodiment, the interconnects 40 may have a width of about twenty (20) nanometers. In an embodiment, the pitch, P, of the interconnects 40, 42 may be as small as about forty (40) nanometers, which is considerably less than the conventional minimum pitch for LELE of 64 nanometers. In an embodiment, the pitch of the interconnects 40, 42 may be in a range of about forty (40) nanometers to less than sixty-four (64) nanometers. The interconnects 40, 42 may be formed with a different pitch by adjusting the pitch of the trenches 22 and/or by adjusting the thickness of the sidewall spacers 28. The ability to adjust the parameters of the different color patterns permits interconnects with a different pitch to be formed in the same metallization level as the interconnects 40, 42 using the same process flow. For example, additional interconnects with a pitch ranging from sixty-four (64) nanometers up to about five hundred (500) nanometers may be concurrently formed by the process flow along with the interconnects 40, 42.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    forming a layer stack on an interlayer dielectric layer, wherein the layer stack includes a first dielectric hardmask layer deposited directly on the interlayer dielectric layer, a metal nitride hardmask layer deposited directly on the first dielectric hardmask layer, and a second dielectric hardmask layer deposited directly on the metal nitride hardmask layer;
    patterning the second dielectric hardmask layer to form a plurality of first trenches arranged with a first pattern, wherein the first trenches extend to the metal nitride hardmask layer;
    forming a plurality of sidewall spacers inside the first trenches on respective sidewalls of the second dielectric hardmask layer bordering the first trenches;

forming a first etch mask over the second dielectric hardmask layer that includes an opening exposing a first portion of the second dielectric hardmask layer between a pair of the sidewall spacers;

removing the first portion of the second dielectric hardmask layer exposed by the opening in the first etch mask to define a second trench in the second dielectric hardmask layer, wherein the second trench extends to the metal nitride hardmask layer;

successively etching the metal nitride hardmask layer and the first dielectric hardmask layer with different etching processes to define a third plurality of trenches having a composite pattern given by the first trenches and the second trench, wherein the third trenches extend to the interlayer dielectric layer;

transferring the third plurality of trenches having the composite pattern from the metal nitride hardmask layer and the first dielectric hardmask layer to the interlayer dielectric layer; and depositing a conductor in the third plurality of trenches in the interlayer dielectric layer to form a plurality of interconnects.

2. The method of claim 1 wherein patterning the second dielectric hardmask layer to form the first trenches arranged with the first pattern comprises:

forming a second etch mask with a first lithography process over the second dielectric hardmask layer that includes a plurality of openings exposing a plurality of second portions of the second dielectric hardmask layer; and removing the second portions of the second dielectric hardmask layer with a first etching process to form the first trenches at respective locations of the openings in the second etch mask.

3. The method of claim 2 wherein the first etch mask is formed with a second lithography process, and the first portion of the second dielectric hardmask layer is removed with a second etching process.

4. The method of claim 1 further comprising:

after removing the first portion of the second dielectric hardmask layer exposed by the opening in the first etch mask to define the second trench in the second dielectric hardmask layer, forming a block mask over a portion of one of the first trenches in the second dielectric hardmask layer.

5. The method of claim 4 wherein the block mask is arranged over a portion of the metal nitride hardmask layer.

6. The method of claim 1 wherein the opening in the first etch mask overlaps with each of the pair of the sidewall spacers adjacent to the first portion of the second dielectric hardmask layer.

7. The method of claim 6 wherein the pair of the sidewall spacers self-align an etching process that removes the first portion of the second dielectric hardmask layer.

8. The method of claim 1 wherein second trenches have a width dimension, and the sidewall spacers reduce the width dimension of the second trenches.

9. The method of claim 1 wherein the second dielectric hardmask layer is patterned with a first lithography process and a first etching process to form the first trenches, the first etch mask is formed with a second lithography process, and the first portion of the second dielectric hardmask layer is removed with a second etching process.

10. The method of claim 9 wherein the pair of the sidewall spacers self-align the second etching process.

11. The method of claim 1 wherein each of the sidewall spacers in the pair is arranged between the second trench and one of the first trenches.

12. The method of claim 1 wherein the interconnects have a width of about twenty nanometers.

13. The method of claim 1 wherein the interconnects have a pitch in a range of about forty nanometers to less than sixty-four nanometers.

* * * * *